United States Patent
Lee (10) Patent No.: US 6,385,121 B2
(45) Date of Patent: May 7, 2002

(54) SEMICONDUCTOR MEMORY DEVICE HAVING A PLURALITY OF BANKS SHARING A COLUMN CONTROL UNIT

(75) Inventor: Byung Jae Lee, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/750,228

(22) Filed: Dec. 29, 2000

(30) Foreign Application Priority Data

Dec. 30, 1999 (KR) ............................................ 99-66395

(51) Int. Cl.[7] ................................................ G11C 8/00
(52) U.S. Cl. .......................... 365/230.03; 365/230.66; 365/63
(58) Field of Search ....................... 365/230.03, 230.06, 365/51, 63

(56) References Cited

U.S. PATENT DOCUMENTS 6,175,532 B1 * 1/2001 Ooshi ..................... 365/230.03

* cited by examiner

Primary Examiner—Huan Hoang
(74) Attorney, Agent, or Firm—Pillsbury Winthrop LLP (57) ABSTRACT

The present invention discloses a semiconductor memory device having a plurality of banks sharing a column control unit. One column control unit is constructed to share a plurality of banks, which are adjacent with each other, thereby reducing a chip area and decreasing current consumption, and a write driver is constructed by using a cross-coupled amplifier, thereby reducing a layout area. A switching unit selectively connects a plurality of banks to a column control unit to by a control signal generated through a bank address signal and so the number of a data bus sense amplifier DBSA and a write driver WD can be reduced, thereby reducing a chip area and a current consumption. A global data bus, which is selected and then driven, and a global data bus, which is not selected and then is not driven, are equalized, as a result, there is an advantage that a current consumption is reduced in pre-charging and a pre-charge time is reduced.

17 Claims, 6 Drawing Sheets

SEMICONDUCTOR MEMORY DEVICE HAVING A PLURALITY OF BANKS SHARING A COLUMN CONTROL UNIT

BACKGROUND OF THE INVENTION

1. Field of the Invention

The present invention relates in general to a semiconductor memory device. More specifically, the invention relates to a semiconductor memory device having a plurality of banks sharing a column control unit.

2. General Background and Related Art

Figure 1:
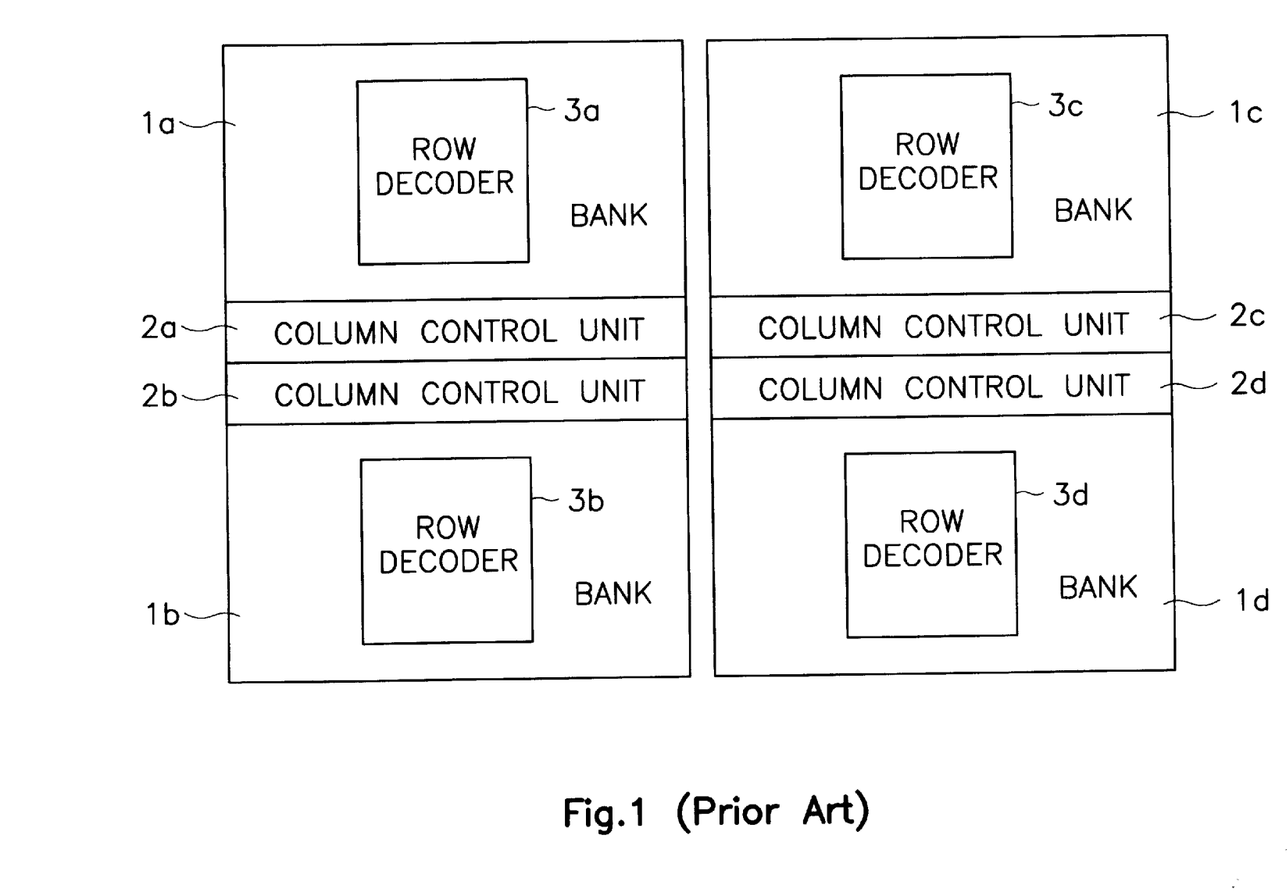
FIG. 1 is a block diagram of a semiconductor memory device having a conventional bank structure.

FIG. 1 is a block diagram of a semiconductor memory device constructed by four banks in accordance with a conventional art.

The semiconductor memory device comprises four banks 1a–1d and column control units 2a–2d, each arranged at an one end of the corresponding hank, for controlling the banks 1a–1d. Each of the column control units 2a–2d include 32 write drivers (not shown) and 32 data bus sense amplifiers (not shown).

Each of the banks 1a–1d includes the corresponding row decoders 3a–3d, which are arranged to the center of each bank, and 32 pairs of global data bus (not shown).

Figure 2:
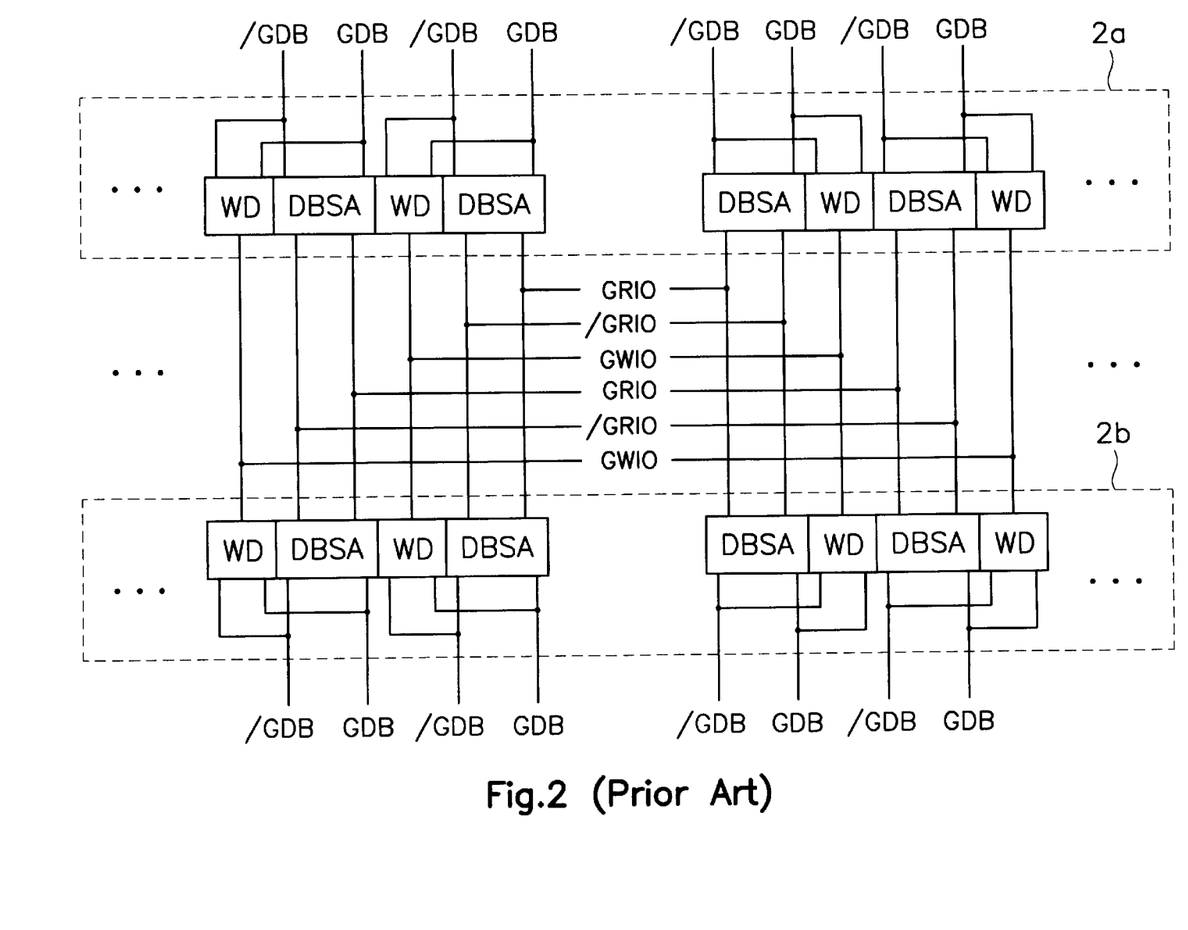
FIG. 2 is a detailed block diagram of a column control unit shown in FIG. 1.

FIG. 2 is a block diagram illustrating column control units 2a and 2b for controlling two adjacent banks 1a and 1b in the block diagram of FIG. 1. There are a number pairs of write driver WD and data bus sense amplifier DBSA. Each write driver WD drives data loaded to a global write input/output line GWIO being shared by four banks 1a–1d and then outputs the data to a pair of global data buses GDB and /GDB of the respective banks 1a–1d, and each data bus sense amplifier DBSA amplifies data loaded to a pair of global data buses GDB and /GDB of the respective banks 1a–1d and outputs the data to a pair of global read input/output lines GRIO and /GRIO being shared by four banks 1a–1d.

Figure 3:
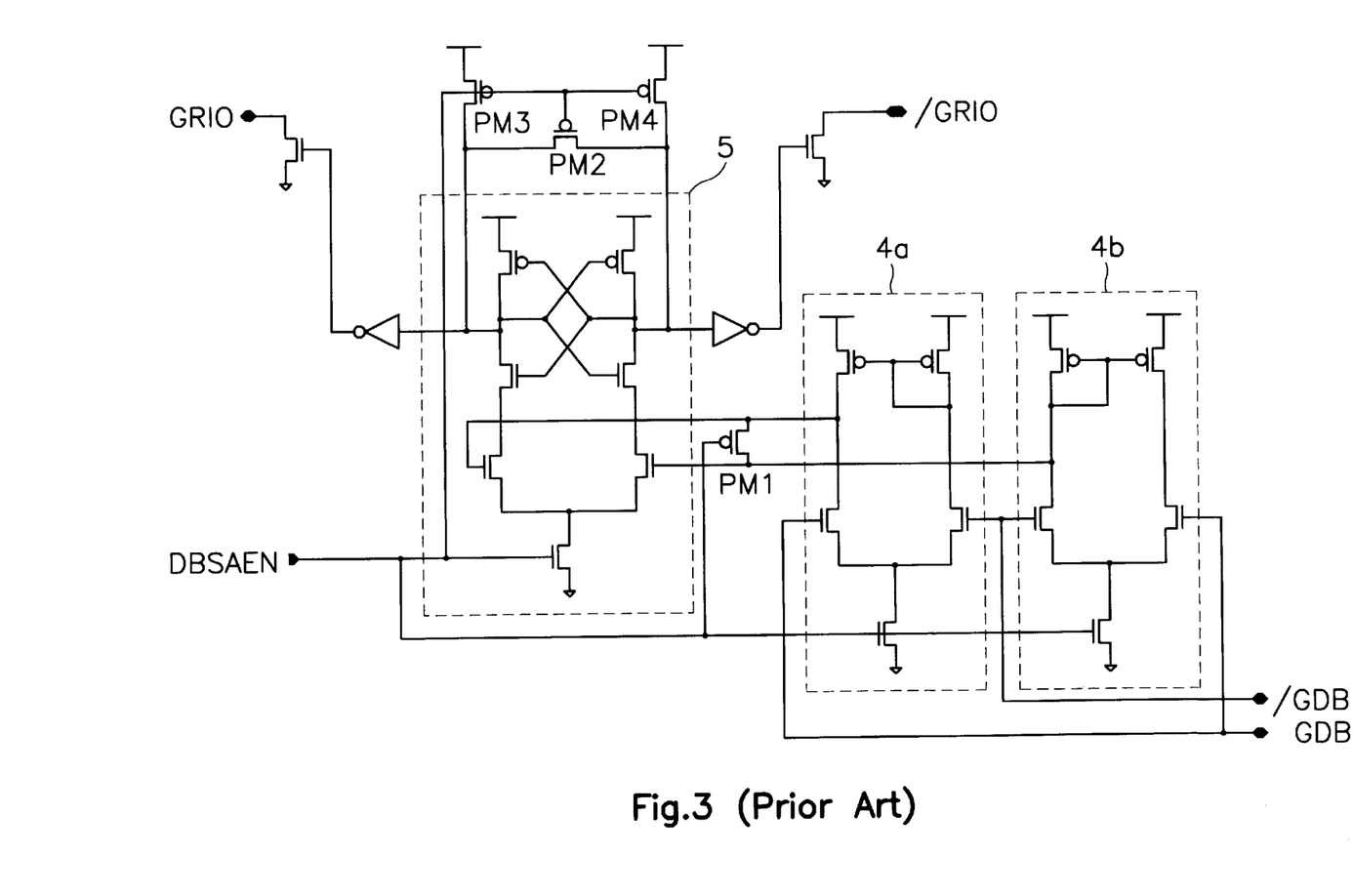
FIG. 3 is a detailed circuit diagram of a data bus sense amplifier shown in FIG. 2.

FIG. 3 is a detailed circuit diagram of the data bus sense amplifier DBSA of the column control units 2a and 2b. The data bus sense amplifier DBSA includes differential amplifiers 4a and 4b, enabled by a data bus sense amplifier enable signal DBSAEN for sensing data loaded to a pair of global data buses GDB and /GDB. A cross-coupled amplifier 5 senses and amplifies the data enabled by the data bus sense amplifier enable signal DBSAEN and then sensed by the differential amplifiers 4a and 4b and then transmits the sensed and amplified data to a pair of global read input/output lines GRIO and /GRIO. Data bus sense amplifier DBSA includes a PMOS transistor PM1 for equalizing output lines of the differential amplifiers 4a and 4b when the data bus sense amplifier enable signal DBSAEN is disabled. PMOS transistors PM2-PM4 pre-charge and equalize the output terminal of the cross-coupled amplifier 5 with a constant level when the data bus sense amplifier enable signal DBSAEN is disabled.

Figure 4:
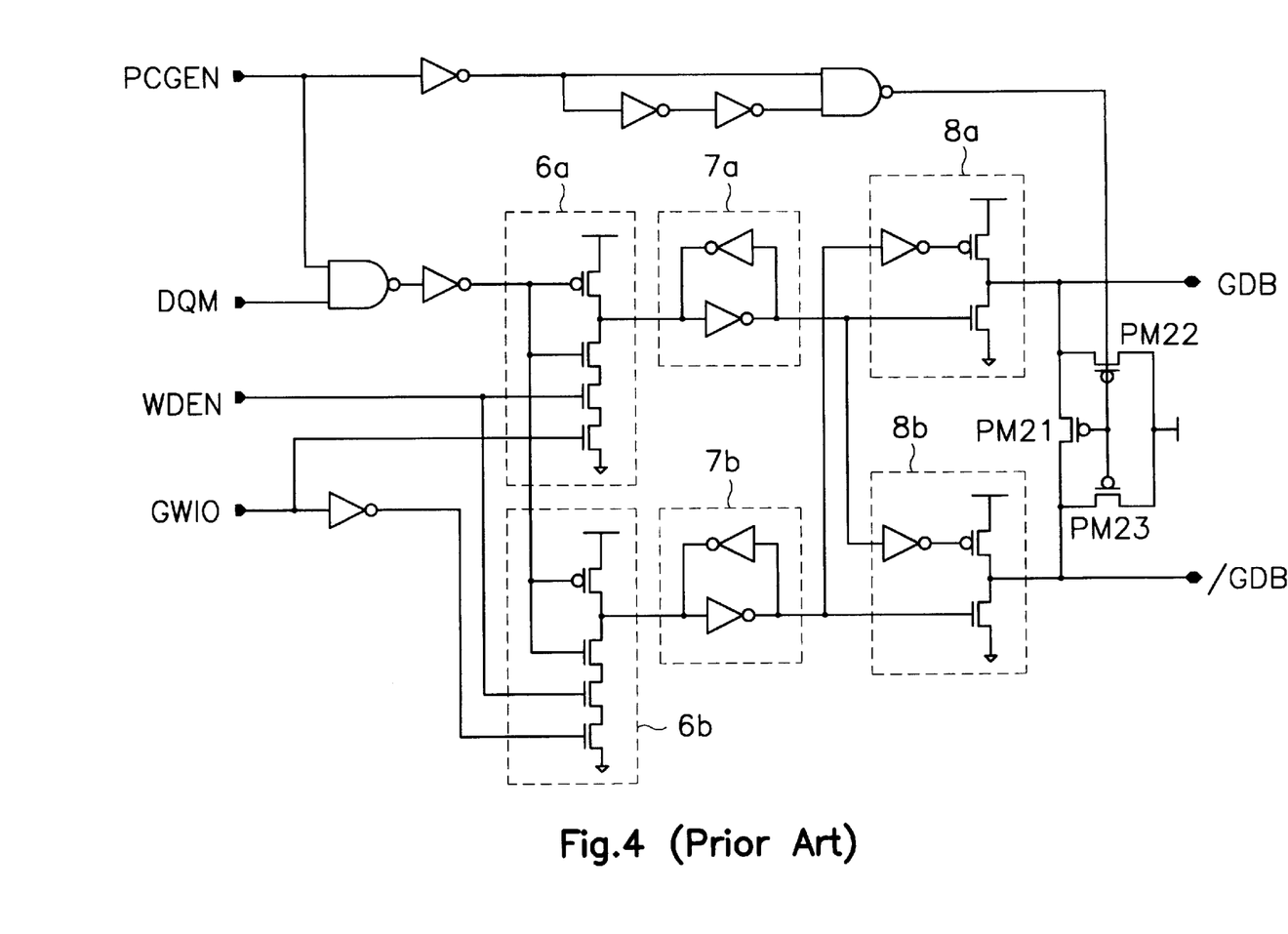
FIG. 4 is a detailed circuit diagram of a write driver shown in FIG. 2.

FIG. 4 is a detailed circuit diagram of the write driver WD of the column control units 2a and 2b. The write driver WD includes decoding units 6a and 6b for decoding the data loaded to a global write input/output line GWIO shared by four banks 4a–4d when a pre-charge enable signal PCGEN is disabled and a write drive enable signal WDEN is enabled.

Latch units 7a and 7b latch the decoded data from decoding units 6a and 6b. Drive units 8a and 8b transmit the latched data from the latch unit 7a and 7b to a pair of global data busses GDD and /GDB of each bank.

The write driver WD further includes a PMOS transistor PM21 for equalizing the global data busses GDB and /GDB. PMOS transistors PM22 and PM23 pre-charge the global data busses GDB and /GDB with a constant level.

The conventional semiconductor memory device has 32 pairs of write drivers WD and data bus sense amplifiers DBSA having MOS devices of very large size in order to promote a transmission efficiency of banks of 1a–1b, respectively. As a result, 128 write driver units WD and data bus sense amplifiers DBSA should be equipped, in the entire the semiconductor memory device. This is disadvantageous in that the chip area must be made to be very large and a current consumption increases.

SUMMARY

The claimed inventions feature, at least in part, a semiconductor memory device in which a plurality of banks, which are adjacent to each other, share one column control unit, thereby reducing a chip area and decreasing current consumption. A write driver in the present invention is constructed by using a cross-coupled amplifier, thereby reducing a layout area.

The column control unit is selectively connected with a plurality of banks by using a switching unit which is controlled by a control signal assembled with bank addresses. Therefore, the number of a data bus sense amplifiers and a drivers needed in the column control unit is decreased. Consequently, chip area can be reduced, speed is enhanced, and current consumption is decreased. An exemplary embodiment of a semiconductor memory device according to the inventions herein includes a plurality of memory banks wherein each memory bank has multiple pairs of global data bus for transferring data from or to itself. A plurality of column control means controls input and output of data between the memory bank and the outside devices. Each column control means is arranged between adjacent ones of the plurality of memory banks, and controls the input or output of data of the adjacent ones. Each column control means includes: 1) a plurality of write drivers, each assigned to one pair of global data bus, for transferring the data inputted from the outside devices into the memory bank; 2) a plurality of data bus sense amplifiers, each assigned to one pair of global data bus, for sensing and amplifying data from the memory bank and then outputting the amplified data toward the outside devices; and 3) a plurality of switching means for connecting one of the adjacent ones with the outside devices with the plurality of write drivers and data bus sense amplifiers.

BRIEF DESCRIPTION OF THE DRAWINGS

The claimed inventions will be explained in terms of exemplary embodiments that are described in detail with reference to the accompanying drawings, which are given only by way of illustration and thus are not limitative of the present invention, wherein:

DETAILED DESCRIPTION

A semiconductor memory device in accordance with an exemplary preferred embodiment of the present invention will now be described with reference to the accompanying drawings.

Figure 5:
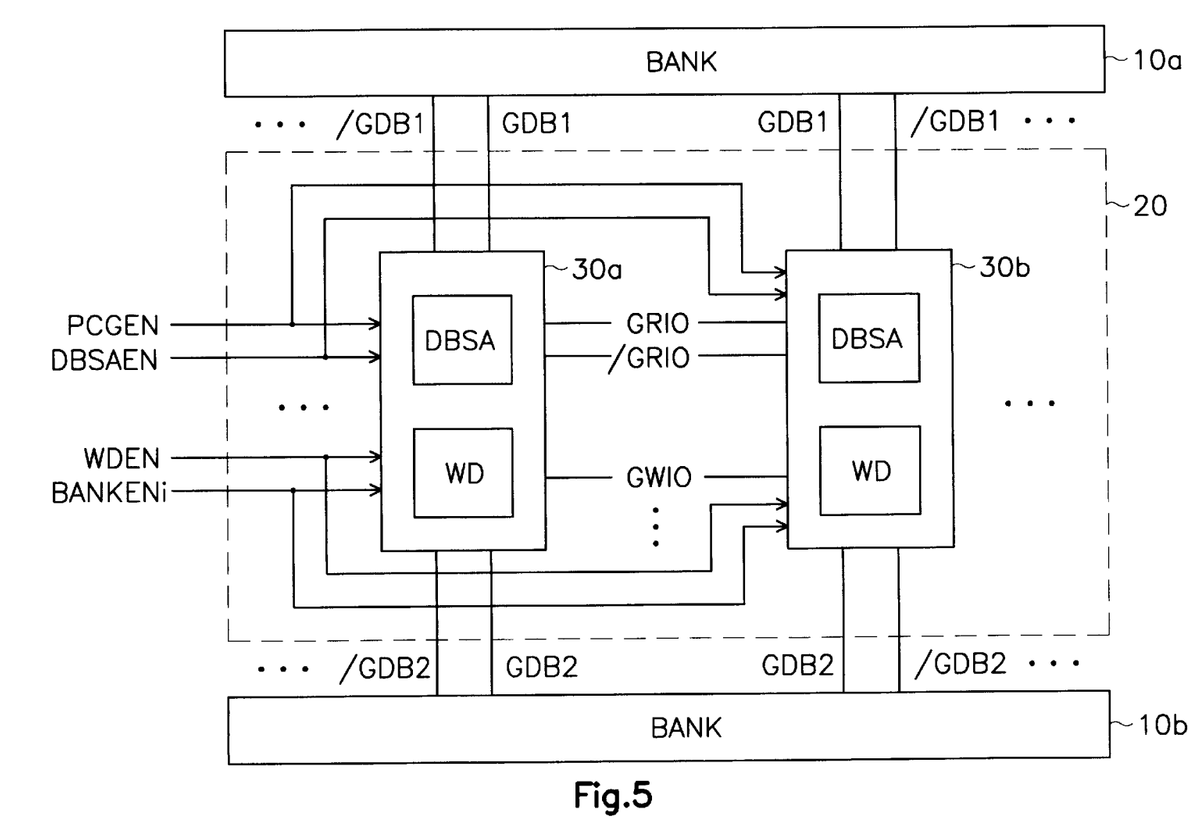
FIG. 5 is a detailed block diagram of a semiconductor memory device having a bank structure in accordance with the present invention.

FIG. 5 is a detailed block diagram of a semiconductor memory device having a bank structure in accordance with the present invention. In our arrangement, two adjacent banks 10a and 10b share a column control unit 20. In general, for semiconductor memory arrangements including a plurality of banks, two adjacent banks 10a and 10b share one column control unit 20.

Data bus sense amplifier DBSA and a write driver WD of the column control unit 20 are shared by two adjacent banks 10a and 10b. The column control unit 20 includes a plurality of unit column control parts 30a and 30b, which are controlled by a pre-charge enable signal PCGEN, a data bus sense amplifier enable signal DBSAEN, a write driver enable signal WDEN and a bank address BANKENi. Each unit column control parts 30a and 30b includes a data bus sense amplifier DBSA and a write driver WD.

Figure 6:
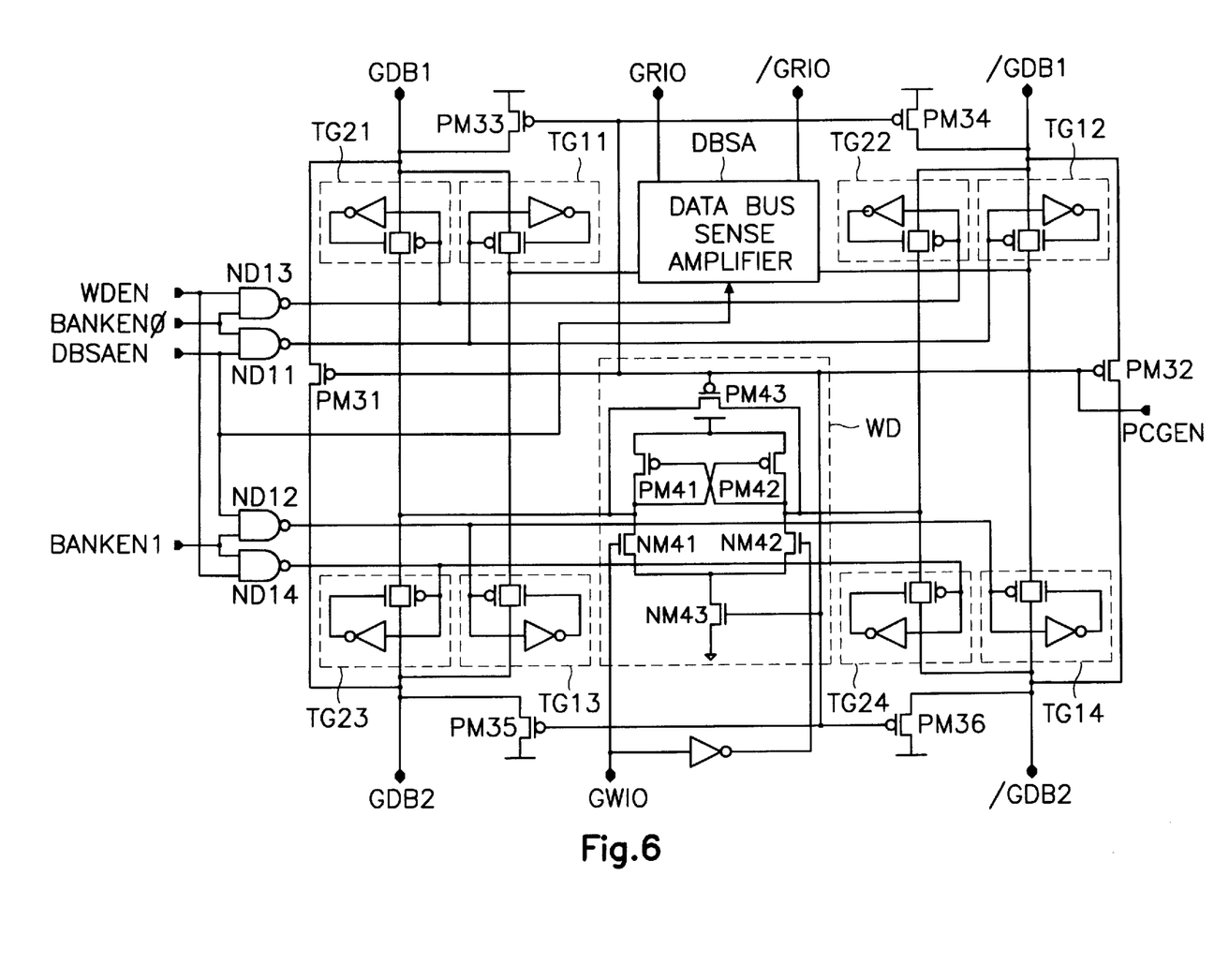
FIG. 6 is a detailed circuit diagram of a column control unit shown in FIG. 5.

FIG. 6 is a detailed circuit diagram of a unit column control parts, such as part 30a or 30b. For the sake of discussion, we will describe the detail of part 30a. Unit column control part 30a includes transfer gates TG11–TG14 controlled by signal that is a logical combination of data bus sense amplifier enable signal DBSAEN and bank address signals BANKEN0 and BANKEN1, combined by NAND gates ND11 and ND12, for selectively connecting a pair of global data busses GDB1 and /GDB1 or GDB2 and /GDB2 of a bank 10a or 10b to a data bus sense amplifier DBSA. Data bus sense amplifier DBSA is enabled by a data bus sense amplifier enable signal DBSAEN and amplifies the data loaded to a pair of global data busses GDB1 and /GDB1 or GDB2 and /GDB2 of a bank 10a or 10b by the transfer gates TG11–TG14 and then transmits the amplified data to a pair of global read input/output lines GRIO and /GRIO. Transfer gates TG21–TG24 are controlled by a logical combination of a write driver enable signal WDEN and bank address signals BANKEN0 and BANKENT1, combined by NAND gates ND13 and ND14. These transfer gates selectively connect a pair of global data busses GDB1 and /GDB1 or GDB2 and /GDB2 of a bank 10a or 10b to a write driver WD. Write driver WD drives data loaded to a global write input/output line GWIO and selectively transmits data to a pair of global data busses GDB1 and /GDB1 or GDB2 and /GDB2 of a bank 10a or 10b by the transfer gates TG21–TG24. PMOS transistors PM31 and PM32, controlled by a pre-charge enable signal PCGEN, equalizes a pair of the global data busses GDB1 and /GDB1 of the bank 10a and a pair of the global data busses GDB2 and /GDB2 of the bank 10b. PMOS transistors PM33–PM36, controlled by the pre-charge enable signal PCGEN, pre-charge a pair of the global data busses GDB1 and /GDB1 of the bank 10a and a pair of the global data busses GDB2 and /GDB2 of the bank 10b.

The write driver WD includes cross-coupled PMOS transistors PM41 and PM42. An NMOS transistors NM41 receive data loaded to the global write input/output line GWIO. An NMOS transistor NM43 enables the write driver WD when the pre-charge enable signal PCGEN is disabled. A PMOS transistor PM43, controlled by the pre-charge enable signal PCGEN, equalizes an output terminal of the write driver WD.

The construction of the data bus sense amplifier DBSA according to the present invention is the same as that of the conventional art and so an explanation of its construction and operation will be omitted.

Transfer gates TG11 and TG12 are controlled by the NAND signal and its inverted signal from an NAND gate 11 for NANDing the data bus sense amplifier enable signal DBSAEN and the bank address signal BANKEN0, and connect selectively a pair of global data busses GDB1 and /GDB1 of a bank 10a to the data bus sense amplifier DBSA, respectively. Transfer gates TG13 and TG14 are controlled by the NAND signal and its inverted signal from an NAND gate 12 for NANDing the data bus sense amplifier enable signal DBSAEN and the bank address signal BANKEN1, and connect selectively a pair of global data busses GDB2 and /GDB2 of a bank 10b to the data bus sense amplifier DBSA, respectively.

Transfer gates TG21 and TG22 are controlled by the NAND signal and its inverted signal from an NAND gate 13 for NANDing the write driver enable signal WDEN and the bank address signal BANKEN0, and connect selectively a pair of global data busses GDB1 and /GDB1 of a bank 10a to the write driver WD, respectively. The transfer gates TG23 and TG24 are controlled by NAND signal and its inverted signal from an NAND gate 14 for NANDing the write driver enable signal WDEN and the bank address signal BANKEN1, and connect selectively a pair of global data busses GDB2 and /GDB2 of a bank 10b to the write driver WD, respectively.

The operation of the unit column control parts 30a and 30b will be now described. First, in a write operation, when a pre-charge enable signal PCGEN is disabled at a high level, an NMOS transistor NM43 of a write driver WD is turned on and the write driver WD is enabled so that data loaded to a global write input/output line GWIO drive NMOS transistors NM41 and NM42 and thereby causes the output terminal of the write driver WD to be a logic high level or a logic low level according to the inputted data.

At the beginning of operation of the write driver WD, a pair of Global data busses GDB1 and /GDB1 of a bank 10a or a pair of global data busses GDB2 and /GDB2 of a bank 10b, which are loaded with high, are cut by the transfer gates TG15 and TG18 so that only an output terminal of the write driver WD, which is loaded with low, reaches a high level or a low level and thereafter the transfer gates TG15 and TG18 are turned on by a control signal delayed with a constant time and produced by bank address signals BANKEN0 and BANKEN1 and then the data is transmitted to a global data bus of the selected bank 10a or 10b.

In a pre-charge operation, if a pre-charge enable signal PCGEN is enabled at a low level, the output terminal of the write driver WD is equalized by the PMOS transistor 43 of the write driver WD and the NMOS transistor NM43 is turned off so that the write driver WD is not operated any more.

Successively, PMOS transistors PM33–PM36 are turned on, thereby pre-charging the global data busses GDB and /GDB at a constant level. In addition, PMOS transistors PM31 and PM32 are turned on, thereby equalizing a pair of global data busses GDB1 and /GD21 of the bank 10a and a pair of global data busses GDB2 and /GDB2 of the bank 10b. Here, after a pair of global data busses GDB1 and /GDB1 or GDB2 and /GDB2 of the selected bank 10a or 10b are driven, a pair of global data busses GDB2 and /GDB2 or GDB1 and /GDB2 of the non-selected bank 10b or 10a are equalized so that a current consumption in pre-charging can be reduced and a pre-charge time can be reduced.

The data bus sense amplifier DBSA and the write driver WD of the column control unit 20 are selectively connected a pair of global data busses GDB1 and /GDB1 or GDB2 and /GDB2 and shared by using transfer gates TG11–18 controlled by a control signal generated by bank addresses BANKEN0 and BANKEN1 so that the number of the data bus sense amplifier DBSA and the write driver WD can be reduced, thereby reducing a chip area and a current consumption.

According to the present invention, a switching unit is used in order to selectively connect a plurality of banks to a column control unit to by a control signal generated through a bank address signal so that the number of a data bus sense amplifier DBSA and a write driver WD can be reduced, thereby reducing a chip area and a current consumption.

A global data bus, which is selected and then driven, and a global data bus, which is not selected and then is not driven, are equalized, as a result, there is an advantage in that a current consumption is reduced in pre-charging and a pre-charge time is reduced.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A semiconductor memory device, comprising:
   a plurality of memory banks wherein each memory bank has multiple pairs of global data bus for transferring data from or to itself;
   a plurality of column control means, each arranged between adjacent ones of the plurality of memory banks and selecting one of the adjacent banks in accordance with bank addresses, for transferring data between the global data bus of the selected bank and global read/write IO bus which are common assigned to the adjacent banks.

2. The memory device according to claim 1, wherein the column control means further comprises:
   a plurality of equalizing means for equalizing a pair of global data busses of a plurality of banks, which are controlled by a pre-charge enable signal and share each column control means; and
   a plurality of pre-charge means for pre-charging a pair of global data busses of a bank, which are controlled by a pre-charge enable signal and share each column control means.

3. The memory device according to claim 2, wherein the equalizing means comprises a MOS transistor.

4. The memory device according to claim 1, wherein each column control means comprises:
   a plurality of write drivers, each assigned to one pair of global data bus, for transferring the data inputted from the global write IO bus to the global data bus;
   a plurality of data bus sense amplifiers, each assigned to one pair of global data bus, for sensing and amplifying the data inputted from the global data bus and then transferring the amplified data to the global read IO bus; and
   a plurality of switching means, controlled by control signals logical combined with bank addresses, data bus sense amplifier enable signals and write driver enable signals, for connecting the selected one of the adjacent banks with the plurality of write drivers and data bus sense amplifiers.

5. The memory device according to claim 4, wherein each switching means comprises:
   a plurality of first transfer means, controlled by signal that is a logical combination of a data bus sense amplifier enable signal and a bank address, for selectively connecting a pair of global data busses of the selected bank to a data bus sense amplifier; and
   a plurality of second transfer means, controlled by signal that is a logical combination of a write driver enable signal with a bank address, for selectively connecting a pair of global data busses of the selected bank to a write driver.

6. The memory device according to claim 5, wherein the first and second transfer means are transfer gates.

7. The memory device according to claim 4, wherein the write driver is a cross-coupled amplifier, which senses and amplifies data loaded to a global write input/output line and its inverted signal.

8. The memory device according to claim 7, wherein the cross-coupled amplifier comprises:
   cross-coupled first and second MOS transistors;
   a third MOS transistor being inputted data loaded to the global write input/output line;
   a fourth MOS transistor being inverted and then inputted data loaded to the global write input/output line;
   a fifth MOS transistor for enabling a write driver when disabling a pre-charge signal; and
   a sixth MOS transistor controlled by the pre-charge enable signal and for equalizing an output terminal of the write driver.

9. The memory device according to claim 8, wherein the fifth and sixth MOS transistors are turned on alternately.

10. A semiconductor memory device, comprising:
    a plurality of memory banks wherein each memory bank has multiple pairs of global data bus for transferring data from or to itself;
    a plurality of write drivers, each assigned to one pair of global data bus, for transferring the data inputted from a global write IO bus to the global data bus;
    a plurality of data bus sense amplifiers, each assigned to one pair of global data bus, for sensing and amplifying data from the global data bus and then transferring the amplified data to a global read IO bus; and
    a plurality of switching means, controlled by control signals logical combined with bank addresses, data bus sense amplifier enable signals and write driver enable signals, for connecting a selected one of the adjacent banks with the plurality of write drivers and data bus sense amplifiers.

11. The memory device according to claim 10, wherein each switching means comprises:
    a plurality of first transfer devices constructed and arranged to be controlled by a signal combining a data bus sense amplifier enable signal with a bank address and to selectively connect a pair of global data busses of the selected bank to data bus sense amplifier; and
    a plurality of second transfer devices constructed and arranged to be controlled by a signal combining a write driver enable signal with a bank address and to selectively connect a pair of global data busses of the selected bank to a write driver.

12. The memory device according to claim 11, wherein the first and the second transfer devices are transfer gates.

13. The memory device according to claim 10, further comprising:
   a plurality of equalizers constructed and arranged to equalize a pair of global data busses of a plurality of banks, which are controlled by a pre-charge enable signal and share each column control; and
   a plurality of pre-chargers each being constructed and arranged to pre-charge a pair of global data busses of a bank, which are controlled by a pre-charge enable signal and share each column control.

14. The memory device according to claim 13, wherein each equalizer comprises a MOS transistor.

15. The memory device according to claim 10, wherein the write driver is a cross-coupled amplifier, which senses and amplifies data loaded to a global write input/output line and its inverted signal.

16. The memory device according to claim 15, wherein the cross-coupled amplifier comprises:
   cross-coupled first and second MOS transistors;
   a third MOS transistor receiving data loaded to the global write input/output line;
   a fourth MOS transistor being inverted and then inputted data loaded to the global write input/output line;
   a fifth MOS transistor for enabling a write driver when disabling a pre-charge signal; and
   a sixth MOS transistor controlled by the pre-charge enable signal and for equalizing an output terminal of the write driver.

17. The memory device according to claim 16, wherein the fifth and sixth MOS transistors are turned on alternately.

* * * * *